US006933534B1

(12) United States Patent
Steffensmeier

(10) Patent No.: US 6,933,534 B1
(45) Date of Patent: Aug. 23, 2005

(54) DISPLAY HAVING DIFFERING ELEMENT SIZES TO IMPROVE EFFICIENCY, LUMINANCE, CHROMATICITY, AND LIFETIME

(75) Inventor: Martin J. Steffensmeier, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 76 days.

(21) Appl. No.: 10/378,297

(22) Filed: Mar. 3, 2003

(51) Int. Cl.[7] .......................... H01L 29/20; H01L 29/06
(52) U.S. Cl. ........................................... 257/89; 257/10
(58) Field of Search ..................... 257/89, 10; 365/250

(56) References Cited

U.S. PATENT DOCUMENTS

2003/0197189 A1 * 10/2003 Iijima ........................... 257/89

* cited by examiner

Primary Examiner—Amir Zarabian
Assistant Examiner—Kiesha Rose
(74) Attorney, Agent, or Firm—Nathan O. Jensen; Kyle Eppele

(57) ABSTRACT

An emissive display system includes a matrix of pixels. The matrix of pixels can be comprised of two or more elements. The two or more elements have different areas from each other. The different areas allow the elements to be driven at similar or preferred drive biases and energies despite the different materials utilized to manufacture the elements.

20 Claims, 3 Drawing Sheets

DISPLAY HAVING DIFFERING ELEMENT SIZES TO IMPROVE EFFICIENCY, LUMINANCE, CHROMATICITY, AND LIFETIME

FIELD OF THE INVENTION

The present application relates to visual displays. More particularly, the present application relates to emissive displays having pixel elements sized to optimize efficiency, luminance, chromaticity and lifetime.

BACKGROUND OF THE INVENTION

Display devices have utilized a variety of techniques to provide dynamic or static images. According to one type of display, an array of pixels emit colored light to achieve an image discernable by an operator. Such emissive displays can utilize pixels comprised of organic light emitting diode (OLED) and polymer light emitting diode (PLED) elements. For a conventional color display, each color pixel is comprised of at least three OLED or PLED elements.

With reference to FIG. 1, a conventional pixel 20 for a conventional display includes a red element 22, a blue element 24 and a green element 26. As shown in FIG. 1, elements 22, 24, and 26 have essentially the same area with respect to each other. Elements 22, 24, and 26 can be patterned according to various photolithographic pattern technologies. Elements 22, 24, or 26 can be PLED or OLED elements or other emissive elements. U.S. Pat. No. 6,013,538, U.S. Pat. No. 6,013,982 and U.S. Pat. No. 6,023,259 describe OLED elements.

According to conventional systems, element 22 emits a first particular color, element 24 emits a second particular color and element 26 emits a third particular color. Elements 22, 24, and 26 each contain unique materials with respect to each other so that they emit the first, second or third color, respectively, in response to a drive signal. However, certain materials emit brighter or higher luminance light than materials associated with other colors in response to the same drive signal. Accordingly, prior art systems have driven weaker color elements at higher voltages relative to the others to provide the appropriate luminance and chromaticity for pixel 20.

Driving weaker elements harder than others accelerates the degradation of those weaker color elements. For example, if element 22 is driven harder than element 26, element 22 will degrade and eventually fail before element 26. Therefore, the need to drive one of elements 22, 24, and 26 with more energy than other elements leads to a premature failure of the display.

Thus, there is a need for an emissive display having pixels comprised of elements which are driven equally. Further still, there is a need for a display which addresses efficiency, luminance, chromaticity and lifetime. Even further still, there is a need for a pixel having OLED or PLED elements optimized for operation in a most efficient operating region.

SUMMARY OF THE INVENTION

An exemplary embodiment relates to an avionic including a plurality of pixels. The pixels are comprised of a plurality of emitting elements. The emitting elements have a first element capable of emitting a first color and a second element capable of emitting a second color. The first element has a first area and the second element has a second area. The first area is larger than the second area.

Another exemplary embodiment relates to a display. The display includes a matrix of color pixels. The color pixels are comprised of a first element capable of providing a first color, a second element capable of providing a second color, and a third element capable of providing a third color. The first color is different than the second color and the third color. The second color is different than the third color. The first element has a first area, and the second element has a second area. The first area is larger than the second area.

Still another exemplary embodiment relates to a pixel for a display. The pixel includes a first element capable of providing a first color, a second element capable of providing a second color, and a third element capable of providing a third color. The first color is different than the third color and the second color. The second color is different than the third color. The first element has a first area, and the second element has a second area. The first area is larger than the second area.

Still another exemplary embodiment relates to a display. The display includes a matrix of color pixels. The color pixels are comprised of a first means for providing a first color, a second means for providing a second color, and a third means for providing a third color. The first color is different than the second color and the third color. The second color is different than the third color. The first element has a first area, and the second element has a second area. The first area is larger than the second area.

Still another exemplary embodiment relates to a method of manufacturing a display. The display includes a number of pixels. The method includes providing a first emissive element, providing a second emissive element and providing a third emissive element. The first emissive element is capable of emitting a first color, and the second emissive element is capable of emitting a second color. The third emissive element is capable of emitting a third color. The first color is different than the second and third colors. The second color is different than the third color. The first emissive element has a first area and the second emissive element has a second area. The first area is larger than the second area.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 2:
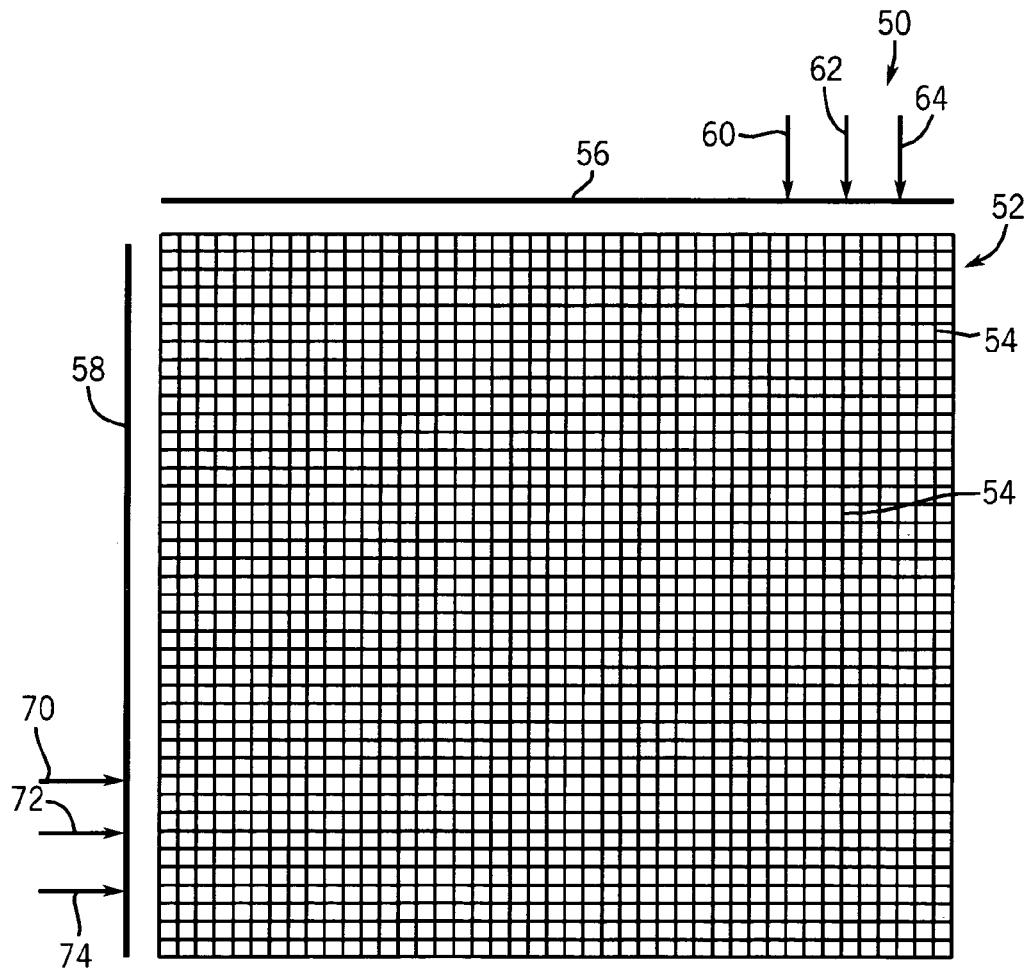
FIG. 2 is a schematic block diagram of a display system including a matrix of pixels, in accordance with an exemplary embodiment.

With reference to FIG. 2, a display system 50 includes a matrix 52 of pixels 54. Display system 50 can be utilized in a variety of applications. In one embodiment, system 50 is an avionic display in which picture quality and product lifetime are important design parameters.

Pixels 54 are driven by electrical signals provided via conductive bars 56 and 58. Conductive bar 56 drives column signals in accordance with color signals received on conductive lines 60, 62, and 64. Similarly, conductive bar 58 provides row color signals provided on conductive lines 70, 72, and 74.

Conductive lines 60, 62, and 64 are configured in illuminate or activate colors such as red, green, and blue in pixels 54. Alternatively, other colors can be represented. The color signals are provided via conductive lines 60, 62, and 64 to drive column signals for matrix 52.

Similarly, conductive lines 70, 72, and 74 drive new color signals for conductive bar 58. The row color signals can represent colors, such as red, green and blue. Lines 60, 62, and 64 and 70, 72, and 74 are coupled in accordance with a conventional scheme which causes pixels 54 to emit a particular color. The conventional scheme can be for both active and passive matrices.

Figure 1:
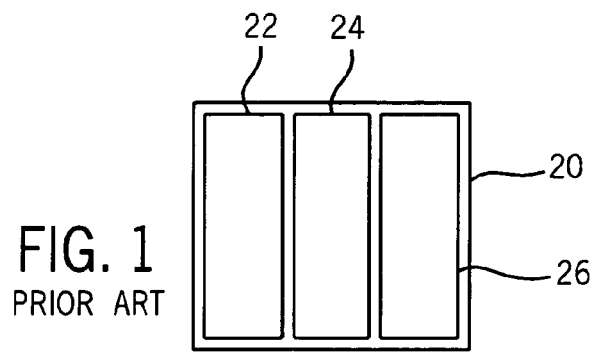
FIG. 1 is a schematic block diagram of a conventional pixel for use in an emissive display.
Figure 3:
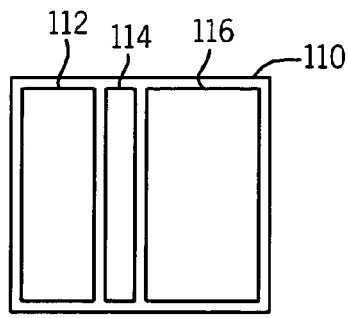
FIG. 3 is a more detailed schematic view of a pixel in the matrix illustrated in FIG. 2, in accordance with a first exemplary embodiment.

With reference to FIG. 3, a pixel 110 can be substituted for any of pixels 54 of matrix 52. Pixel 110 includes an element 112, an element 114, and an element 116. Element 112 can emit a particular color such as blue. Element 114 can emit a particular color such as green, and element 116 can emit a particular color such as red. Unlike conventional pixels (FIG. 1), pixel 110 includes elements 112, 114, and 116 which are different sizes with respect to each other.

As shown in FIG. 3, element 112 has an area between the area of element 114 and element 116. Element 116 has an area greater than element 114.

Various dimensions and arrangements for elements 112, 114 and 116 can be utilized. Although shown with element 114 (the smallest sized element) positioned between element 112 (the medium sized element) and element 116 (the longest sized element), other arrangements can be utilized. In fact, any of the arrangements shown in the various figures can be rotated 90 degrees, flipped about a center horizontal axis, flipped about a center vertical axis or flipped about a vertical or horizontal axis on sides of pixel 110. The arrangements shown in the figures are exemplary arrangements only.

In a preferred embodiment, pixel 110 has a 90,000 square micron area having dimensions of 300 microns by 300 microns. Each of elements 112, 114, and 116 has a height of 300 microns. Element 112 has a width of 90 microns. Element 114 has a width of 60 microns and element 116 has a width of 150 microns. Alternatively, pixel 110 can be designed so that element 114 has a width of one half of element 116 and element 112 has a width between the width of element 114 and element 116. (Element 114 has an area or a width of X; element 116 has an area or a width of 2X and element 112 has an area or width between 1X and 2X.) The above description is for a preferred embodiment only and the claims should be construed to cover any combination of relative sizes and colors unless explicitly required by the claims or the prior art.

The dimensions associated with pixel 110 can be chosen in accordance with various design criteria. Elements 112 and 114 and 116 can be lithographically patterned to have area or widths to compensate for weaker color elements such as element 116. As an example, if element 116 is a red element, it must be larger to have the same luminance at the same drive voltage as elements 114 and 112. Similarly, element 112 must have an area larger than element 114 to have the same luminance at the same drive voltages. In this way, pixel 110 includes elements which are driven relatively equally to increase lifetime and efficiency of pixel 116 without jeopardizing luminance and chromaticity. Although elements 112, 114 and 116 are discussed as having the same luminance, elements 112, 114 and 116 do not necessarily have to have the same luminance depending upon design considerations and display criteria. In fact, elements 112, 114 and 116 can have slightly more or less luminance than each other according to display preferences.

Elements 112, 114, and 116 can be organic light emitting diodes or polymer light emitting diodes. Various manufacturing techniques can be utilized to pattern and fabricate elements 112, 114, and 116. The present application is not limited to any particular method for manufacturing elements 112, 114, and 116. Further, elements 112 and 114, or elements 110 and 112 can have the same area or dimensions rather than the differing dimensions shown in FIG. 3.

Figure 4:
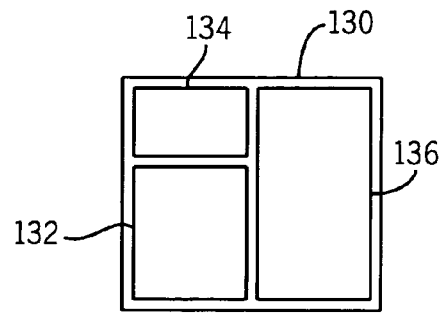
FIG. 4 is a more detailed schematic view of a pixel in the matrix illustrated in FIG. 2, in accordance with a second exemplary embodiment.

With reference to FIG. 4, a pixel 130 is substantially similar to pixel 110 discussed with reference to FIG. 3. However, pixel 130 is comprised of a first element 134, a second element 132 and a third element 136. Element 136 is similar to element 116. Element 132 is similar to element 112. Element 134 is similar to element 114. However, elements 132 and 134 have different heights from each other and from the height of element 136. The configuration in FIG. 4 has elements 134 and 132 having the same widths from left to right as the width of element 136 and different heights to achieve the appropriate area for each element.

Figure 5:
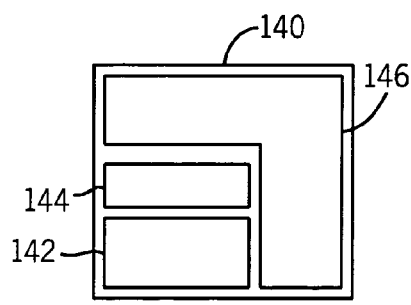
FIG. 5 is a more detailed schematic of a pixel in the matrix illustrated in FIG. 2, in accordance with a third exemplary embodiment.

With reference to FIG. 5, a pixel 140 is similar to pixel 110. However pixel 140 includes a first element 144, a second element 142, and a third element 146. Third element 146 has an L-shape pattern to achieve a greater area than elements 142 and 144. Again the ratio of areas for elements 142, 144, and 146 can be similar to elements 112, 114 and 116 discussed with reference to FIG. 3.

Figure 6:
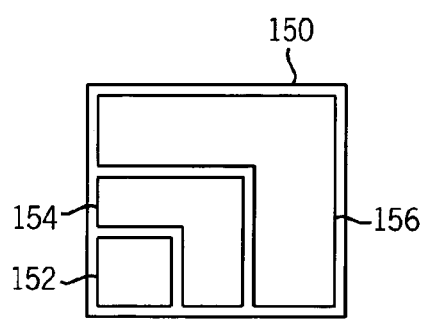
FIG. 6 is a more detailed schematic view of a pixel in the matrix of FIG. 2, in accordance with a fourth exemplary embodiment.

With reference to FIG. 6, a pixel 150 is similar to pixel 140. However, pixel 150 includes an L-shaped element 156, an L-shaped element 154 and a square shaped element 152. The ratio of areas for elements 152, 154, and 156 can be similar to the areas given for elements 114, 112 and 116, respectively.

Figure 7:
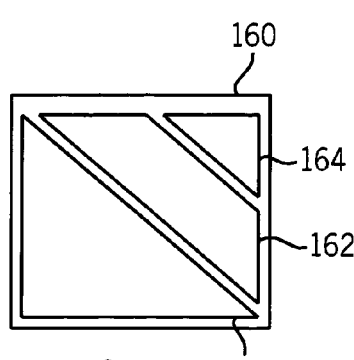
FIG. 7 is a more detailed schematic view of a pixel in the matrix illustrated in FIG. 2, in accordance with a fifth exemplary embodiment.

With reference to FIG. 7, a pixel 160 is similar to pixel 140. However, pixel 160 includes a triangular element 164, a trapezoidal element 162, and a triangular element 166. The ratio of areas between elements 162, 164, and 166 can preferably be similar to the areas given for elements 112, 114, and 116.

Figure 8:
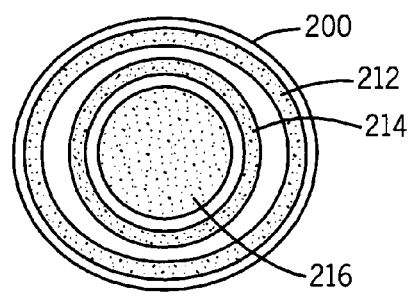
FIG. 8 is a more detailed schematic view of a pixel in the matrix illustrated in FIG. 2, in accordance with a sixth exemplary embodiment.

With reference to FIG. 8, a pixel 200 is similar to pixel 110. However, pixel 200 has a circular shape preferably having an area of approximately 90,000 square microns. Pixel 200 includes a ring shaped element 212 similar to element 112 in FIG. 3, a ring shaped element 214 similar to element 114 in FIG. 3 and a circular element 216 similar to element 116. Preferably, elements 212, 214, and 216 are concentric to each other and can have a ratio of areas similar to elements 112, 114, and 116.

Figure 9:
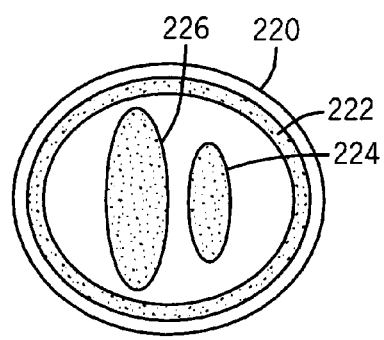
FIG. 9 is a more detailed schematic view of a pixel in the matrix illustrated in FIG. 2, in accordance with a seventh embodiment.

With reference to FIG. 9, a pixel 220 includes a ring shaped element 222, an oval shaped element 224 and an oval shaped element 226. Elements 222, 224, and 226 can have a ratio of areas similar to elements 212, 214, and 216 discussed with reference to FIG. 8.

Figure 10:
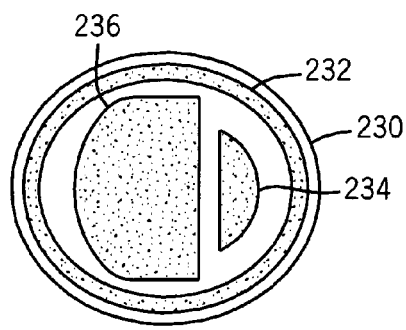
FIG. 10 is a more detailed schematic view of a pixel for the matrix illustrated in FIG. 2, in accordance with an eighth exemplary embodiment.

With reference to FIG. 10, a pixel 230 is similar to pixel 200 and includes a ring shaped element 232, a D-shaped element 234 and a D-shaped element 236. Elements 232, 234, and 236 can have a ratio of areas similar to elements 212, 214, and 216 discussed with reference to FIG. 8.

Figure 11:
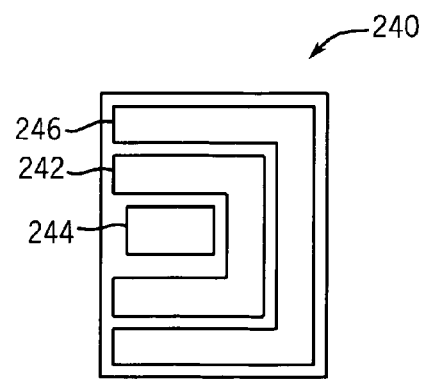
FIG. 11 is a more detailed schematic view of a pixel for the matrix illustrated in FIG. 2, in accordance with a ninth exemplary embodiment.

With reference to FIG. 11, a pixel 240 is similar to pixel 230 and includes a U-shaped element 242, a rectangular element 244, and a U-shaped element 246. Elements 242, 244, and 246 can have a ratio of areas similar to elements 112, 114, and 116.

Although various particular configurations and shapes for elements are discussed with reference to FIGS. 2–11, other configurations and shapes can be utilized. For example, circles, semicircles, D-shaped elements, L-shaped elements, squares, trapezoids, and other polygons can all be used in a variety of configurations. Further, although only circular and square shaped pixels are shown, rectangular, oval, and other shaped pixels can also be formed.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. Various changes may be made to the details disclosed without departing from the spirit of the invention which is defined by the following claims.

What is claimed is:

1. An avionic display including a plurality of pixels, the pixels being comprised of a plurality of emitting elements in an emissive display, the emitting elements having a first element capable of emitting a first color, a second element capable of emitting a second color, and a third element capable of emitting a third color the first element having a first area, the second element having a second area, wherein the first area is larger than the second area, wherein the first element, the second element and the third element generate light in response to electric potential.

2. The display of claim 1, wherein the pixels are further comprised of a third element capable of emitting a third color and having a third area, the third area being smaller than the first area and larger than the second area.

3. The display of claim 2, wherein the first area is at least twice the second area.

4. The display of claim 1, wherein the first color is green and the second color is red.

5. The display of claim 1, wherein the first element and the second element have a rectangular shape and wherein the first element has a first height and a first width, wherein the second element has a second width and a second height, wherein the second height and the first height are equal and the first width is larger than the second width.

6. The display of claim 1, wherein the first element and the second element have a rectangular shape and wherein the first element has a first height and a first width, wherein the second element has a second width and a second height, wherein the second width and the second height are not equal and the first width is larger than the second width.

7. The display of claim 1, wherein the first element and the second element are circular, square shaped, D-shaped or ring shaped.

8. The display of claim 1, wherein the first area is less than 45000 square microns and the second area is less than 18000 square microns.

9. The display of claim 8, wherein the pixels further are comprised of a third element capable of emitting a third color and having a third area, the third area being smaller than the first area and larger than the second area, wherein the third area is less than 27000 square microns.

10. A display comprising a matrix of color pixels, the color pixels being comprised of a first element capable of emitting a first color, a second element capable of emitting a second color, and a third element capable of emitting a third color, the first color being different than the second color and the third color, the second color being different than the third color, the first element having a first area, the second element having a second area, wherein the first area is larger than the second area, wherein the display is an emissive display and not a liquid crystal display.

11. The display of claim 10, wherein each of the color pixels has an area of approximately 90,000 microns.

12. The display of claim 11, wherein the first color is red and the first area is at least twice the second area and the third element has a third area, the third area being larger than the second area and smaller than the first area.

13. A pixel for a display, the pixel comprising:
   a first emissive element in an emissive display capable of providing a first color;
   a second emissive element in an emissive display capable of providing a second color; and
   a third emissive element in an emissive display capable of providing a third color, the first color being different than the second color and the third color, the second color being different than the third color, the first element having a first area, the second element having a second area, wherein the first area is larger than the second area, wherein the first element, the second element, and the third element convert electrical energy into light energy.

14. A display comprising a matrix of color pixels, the color pixels being comprised of a first emissive means in an emissive display for providing a first color, a second emissive means in an emissive display for providing a second color, and a third emissive means in an emissive display for providing a third color, the first color being different than the second color and the third color, the second color being different than the third color, the first means for providing having a first area, the second means for providing having a second area, wherein the first area is larger than the second area.

15. The display of claim 14, wherein the first means, the second means, and the third means are organic light emitting diodes or polymer light emitting diodes.

16. The display of claim 15, wherein each of the color pixels is square-shaped and the first means, the second means and the third means are rectangular.

17. The display of claim 14, wherein the first color is blue.

18. The display of claim 17, wherein the second color is green.

19. The display of claim 18, wherein the third color is red.

20. The display of claim 14, wherein the first area is square shaped.

* * * * *